United States Patent [19]

Kohara et al.

[11] Patent Number: 4,799,093
[45] Date of Patent: Jan. 17, 1989

[54] SEMICONDUCTOR MEMORY DEVICE HAVING A MOS TRANSISTOR AND SUPERPOSED CAPACITOR

[75] Inventors: Masanobu Kohara; Hiroshi Shibata, both of Itami, Japan

[73] Assignee: Mitsubishi Denki Kabushiki Kaisha, Tokyo, Japan

[21] Appl. No.: 611,929

[22] Filed: May 22, 1984

Related U.S. Application Data

[63] Continuation of Ser. No. 313,248, Oct. 21, 1981.

[30] Foreign Application Priority Data

Jan. 17, 1981 [JP] Japan .................................. 56-6607

[51] Int. Cl.[4] ................... H01L 29/78; H01L 27/02; H01L 29/34; H01L 23/48
[52] U.S. Cl. .................................. 357/23.6; 357/51; 357/54; 357/71
[58] Field of Search ................... 357/23 C, 51, 52, 53, 357/56, 71, 59, 54

[56] References Cited

U.S. PATENT DOCUMENTS

| | | | |
|---|---|---|---|
| 3,617,816 | 11/1971 | Riseman et al. | 357/71 |
| 3,699,010 | 10/1972 | Nash | 357/71 |
| 3,809,625 | 5/1974 | Brown et al. | 357/71 |
| 3,890,636 | 6/1975 | Harada et al. | 357/71 |
| 4,012,757 | 3/1977 | Koo . | |
| 4,151,607 | 4/1979 | Koyanagi et al. | 357/41 |
| 4,291,322 | 9/1981 | Clemens et al. | 357/71 |

OTHER PUBLICATIONS

W. M. Smith, Jr., "Vertical One-Device Memory Cell", *IBM Technical Disclosure Bulletin*, vol. 15 (1973) pp. 3585-3586.

*Primary Examiner*—J. Carroll
*Attorney, Agent, or Firm*—Oblon, Fisher, Spivak, McClelland & Maier

[57] ABSTRACT

A semiconductor memory device including a MOS transistor having source and drain electrodes formed on a surface of a semiconductor substrate; an insulating layer formed on a surface of the semiconductor substrate; a first conductive layer which is connected to the source or drain electrodes and is extended on the surface of the insulating layer through the insulating layer; a dielectric layer formed on the surface of said first conductive layer; and a second conductive layer formed on the dielectric layer opposite the first conductive layer, wherein the first conductive layer, the dielectric layer and the second conductive form a capacitor for a memory element.

5 Claims, 1 Drawing Sheet

SEMICONDUCTOR MEMORY DEVICE HAVING A MOS TRANSISTOR AND SUPERPOSED CAPACITOR

This application is a continuation, of application Ser. No. 313,248, filed Oct. 21, 1981.

BACKGROUND OF THE INVENTION

1. Field of the Invention

This invention relates to a semiconductor memory device, and more particularly, to an improvement of a semiconductor memory device in which each memory cell includes at least one MOS transistor and one capacitor.

2. Description of the Prior Art

Recently a semiconductor memory device having high memory capacity and density such as 16 k bits and 64 k bits has been developed. As the structure of the semiconductor memory device, a dynamic memory cell type device wherein each memory cell has one MOS transistor and one capacitor has been used in various fields. In the dynamic memory cell type device, the data of "1" or "0" are memorized in the form of charges stored in the capacitor. Thus, the capacitor should have a relatively large capacitance, resulting in a correspondingly large size. The miniaturization of the area of the memory cell is prevented because of the area of the capacitor whereby a semiconductor memory device having a memory capacity greater than 64 k bits could not be practically attained.

FIG. 1 is a cross-sectional view of the structure of a conventional memory cell wherein a thick partition oxide layer (2) for partitioning elements is formed on a surface of a P-silicon substrate (1) and a p+-layer (3) having high impurity concentration for preventing turnover of the P-silicon substrate (1) to n-type is also formed on the surface of the P-silicon substrate (1). The MOS transistor is formed by a thin gate oxide layer (4) a first polysilicon layer (5) for a gate electrode and wiring, and a n+ diffused layer (6) having high impurity concentration for bit lines of the memory.

The capacitor part is forme by an insulating oxide layer (7) sandwiched between a P-silicon substrate (1) and a second polysilicon layer (8) placed on both sides thereof and serving as counter electrodes.

In the memory cell, all parts of the structure are covered by a thick silicon oxide layer (9) formed by a CVD process. An opening is formed on the first polysilicon layer (5) for the gate electrode and an aluminum wiring layer (10) connected to the first polysilicon layer (5) is formed.

As shown in FIG. 1, the gate of the MOS transistor and the capacitor are formed on one plane in the conventional device. Thus, in order to reduce the size of the memory cell, it is necessary to reduce the area of the capacitor. However, if the area of the capacitor is reduced, the capacitance thereof is also reduced, such that data memorized in the form of the electric charges stored in the capacitor are subject to change by naturally occurring α-rays whereby "soft error" is easily caused.

SUMMARY OF THE INVENTION

Accordingly, an object of the present invention is to provide a new and improved semiconductor memory device having a high memory capacity and density characterized by each memory cell occupying a relatively smaller area, without reducing the capacitance of a capacitor in the memory cell, by superposing the capacitor and the gate of a MOS transistor thereby to avoid forming them in one plane.

The foregoing and other objects of the present invention have been attained by providing a semiconductor memory device which includes a MOS transistor including source and drain electrodes formed on a surface of a semiconductor substrate; an insulating layer formed on a surface of the semiconductor substrate including the source and drain electrodes; a first conductive layer which is connected to the source or drain electrodes through the first insulating layer and is extended on the surface of the insulating layer; a dielectric layer formed on the surface of the first conductive layer; and a second conductive layer formed on the dielectric opposite the first conductive layer.

BRIEF DESCRIPTION OF THE DRAWINGS

A more complete appreciation of the invention and many of the attendant advantages will be readily obtained as the same becomes better understood by reference to the following detailed description when considered in connection with the accompanying drawings, wherein.

DETAILED DESCRIPTION OF THE PREFERRED EMBODIMENTS

Figure 1:
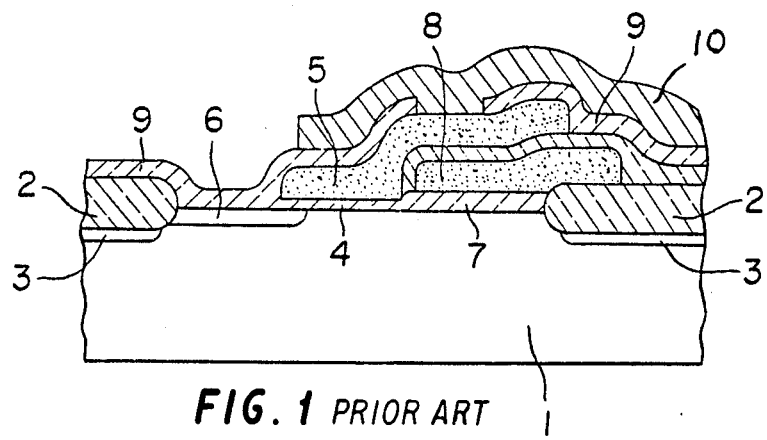
FIG. 1 is a cross-sectional view of the structure of a conventional memory cell.
Figure 2A:
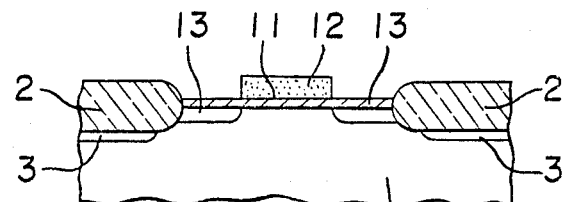
FIGS. 2A, B and C are cross-sectional views illustrating the main steps of production of one embodiment of the memory cell of the present invention.
Figure 2B:
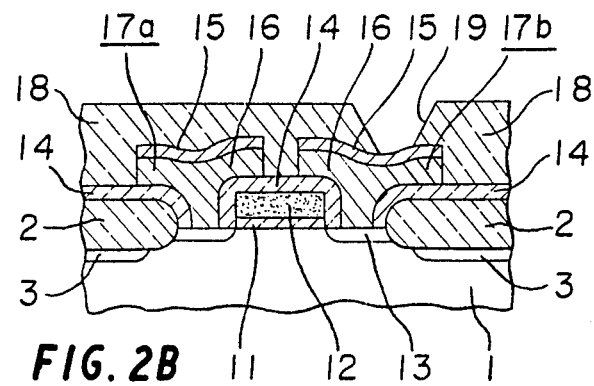
Figure 2C:
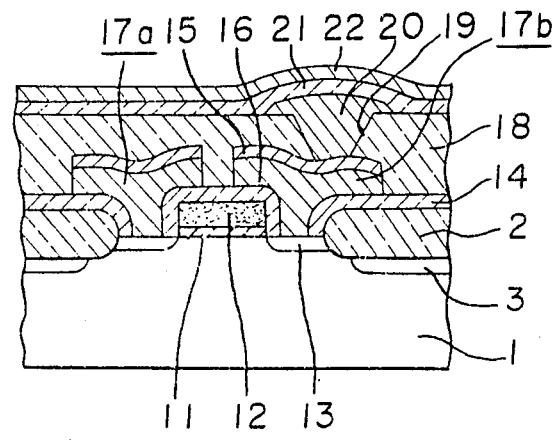

Referring now to the drawings, wherein like reference numerals designate identical or corresponding parts throughout the several views, and more particularly to FIGS. 2A, 2B and 2C thereof, in order to illustrate the structure of one embodiment of the present invention, the steps of the production of the memory cell are shown in FIGS. 2A, 2B and 2C. As shown in FIG. 2A, a thick partition oxide layer (2) for partitioning the elements and a p+ layer (3) for preventing a turnover under the thick partition oxide layer (2 are formed on the surface of a P-silicon substrate (1). Then, a thin oxide layer (11) serving as a gate is formed and a polysilicon layer is deposited by a CVD process, portions of which are removed by a photo-engraving process to form a gate electrode (12). The gate electrode (12) made of the polysilicon is used as a mask and n+ regions (13) for source and drain regions are formed by an ion implantation process.

As shown in FIG. 2B, a thick oxide layer (14) is deposited on all of the surfaces including the gate electrode (12) and respective contact holes are formed in the layer (14) over parts of the source and the drain regions by a photo-engraving process. A multi layer metallic layer (16) having a surface layer (15) made of a metal used for plating, such as copper, nickel, silver or gold, is formed by conventional vacuum evaporation deposition and then, electrodes (17a), (17b) are formed by a photo-engraving process. Then, an insulating layer (18) of a thick oxide layer or an organic dielectric layer such as a polyimide resin layer is formed above all of the parts to cover the electrodes (17a), (17b). Then, a through-hole (19) is formed on the electrode (17) for the capacitor by a photo-engraving process. The through-hole (19) has slanted side walls so as to enlarge upwardly the hole.

The product is dipped in a plating bath for plating Cu, Ni, Ag or Au and the metal is deposited in the through-hole (19) by an electric plating process wherein a negative potential is applied to the rear side of the substrate (1), such that the plated metal layer (20) shown in FIG. 2C is formed so as to extend on the surface layer (18). As a result, the surface area of the plated layer (20 can be remarkably larger than the area of the through-hole (19). Then, a dielectric layer (21) such as a tantalum oxide layer, a silicon oxide layer or a silicon nitride layer is formed on the surface of the insulating layer (18) and also above the plated layer (20) by an evaporation-depositing process, a sputtering process or a CDV process. Finally, a metallic layer such as an aluminum layer is formed on the dielectric layer (21) and a wiring layer (22) having a desired pattern is formed by a photo-engraving process. The semiconductor memory device having the memory cells can thereby be obtained.

In the embodiment, a capacitor is formed by placing the dielectric layer (21) between the plated layer (20) and the wiring layer (22) and accordingly, the gate electrode (12) is not coplanar therewith. Therefore, the capacitor can have sufficiently large area to have a large capacitance without substantially increasing the area of the chip. If a thickness of the insulating layer (18) is 2 $\mu$m or more, a needless floating capacity can be prevented.

As described, in accordance with the semiconductor memory device of the present invention, the gate of the MOS transistor and the capacitor are placed in superposing form. Therefore, an increase in the area of the capacitor to provide a large capacitance does not cause an increase of an area of the chip and a memory device having a high memory capacity without susceptibility to erroneous operation can be obtained. The capacitor does not utilize the pn junction capacity as the conventional memory device, and accordingly, "soft error" caused by naturally occurring $\alpha$-rays can be prevented.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor memory device comprising:
    a semiconductor substate of a first conductivity type having a surface;
    an MOS transistor formed on said surface including a gate of a thin oxide layer formed on said surface as polysilicon gate electrode located on said gate, source and drain regions of high impurity concentrations of a second conductivity type located within said surface, a first oxide layer located over said source region, said drain regions, said gate and said gate electrode, said first oxide layer having a contact hole over each of said source region and said drain region, a source electrode and a drain electrode being located on said first oxide layer and through said contact holes in electrical communication with said source and drain regions, respectively;
    a second oxide layer located on said first oxide layer, said source electrode and said drain electrode, and having a through-hole with slanted sides over one of said source electrode and said drain electrode, said second oxide layer having a thickness of 2 $\mu$m or more so as to diminish a floating capacitance;
    a first conductive layer connected to one of said source electrode and said drain electrode through said through-hole and extending on the surface of said second oxide layer so that the area of said first conductive layer on said surface of said second oxide layer is larger than the area of said first conductive layer where it contacts said one of said source electrode and said drain electrode;
    a dielectric layer formed on the surface of said first conductive layer and on the surface of said second oxide layer;
    a second conductive layer formed on said dielectric layer and over the area covered by said first conductive layer;
    wherein said first conductive layer, said dielectric layer and said second conductive layer form a capacitor; and
    wherein said capacitor is located at least partially above said MOS transistor.

2. Semiconductor memory device according to claim 12, further comprising:
    a thick partition oxide layer formed on said substrate.

3. A semiconductor memory device according to claim 2 further comprising:
    a layer having a high impurity concentration formed beneath said thick partition oxide layer for preventing turnover of said substrate of a first conductivity to a second conductivity.

4. A semiconductor memory device according to claim 1 wherein said source electrode and said drain electrode include at least two metal layers.

5. A semiconductor memory device according to claim 1 wherein said first conductive layer is a metallic layer formed by an electric plating process.

* * * * *